Figure 1:
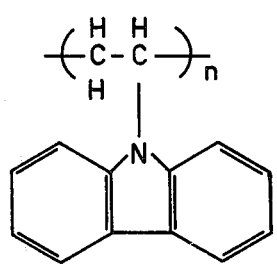

United States Patent [19]

Jagt

[11] 4,348,472

[45] Sep. 7, 1982

[54] METHOD OF APPLYING A LAYER IN ACCORDANCE WITH A PATTERN ON A SUBSTRATE, A NEGATIVE RESIST MATERIAL AND A SUBSTRATE COATED WITH THE RESIST

[75] Inventor: Jannes C. Jagt, Eindhoven, Netherlands

[73] Assignee: U.S. Philips Corporation, New York, N.Y.

[21] Appl. No.: 183,521

[22] Filed: Sep. 2, 1980

[30] Foreign Application Priority Data

Sep. 18, 1979 [NL] Netherlands .................. 7906932

[51] Int. Cl.$^3$ .................. G03C 1/71; B05D 3/06; G03C 1/60; G03F 7/08
[52] U.S. Cl. .................. 430/195; 430/167; 430/270; 430/271; 430/296; 430/907; 430/927; 430/966; 430/325; 427/43.1; 260/349
[58] Field of Search .................. 430/195, 197, 80, 81, 430/82, 966, 967, 296, 325, 270, 271, 907, 927; 427/43.1; 260/349

[56] References Cited

U.S. PATENT DOCUMENTS 3,284,198 11/1966 Grotta et al. .................. 430/304
3,421,891 1/1969 Inami et al. .................. 430/80
3,538,125 11/1970 Kornfeld et al. .................. 260/349
3,705,031 12/1972 Kinjo et al. .................. 430/80

FOREIGN PATENT DOCUMENTS 47-30215 8/1972 Japan .
54-17015 2/1979 Japan .

OTHER PUBLICATIONS

Chemical Abstracts, vol. 82, 1975, Ab. #163043y, (Kazuhisa et al.-Japan Kokai 74-106, 585).

Fredericks et al., *IBM Technical Disclosure Bulletin*, vol. 19, No. 11, 4/77, p. 4193.
Ku et al., "Polymeric Electron Beam Resists," J. Electrochemical Soc., 7/69, pp. 980–985.
Derwent Abstract #20983, 1979, (Jap-Kokai 54-17,015).
*CRL Critical Reviews in Solid State Sciences*, Feb. 1979, pp. 251–262.
Ordung, P. F. et al., "Electron Resists," Naval Weapons Center, DA 044282, 9/77, p. 9.

*Primary Examiner*—Charles L. Bowers, Jr.
*Attorney, Agent, or Firm*—Norman N. Spain

[57] ABSTRACT

A method of providing a negative electron and/or X-ray resist material on a substrate comprising applying a layer of resist material to the substrate, exposing the layer to a pattern of electrons and/or X-rays and removing the unexposed portions of the layer of resist material in which method the resist material comprises a polyvinylcarbazole compound which (a) contains a polymer and/or a copolymer of the formula

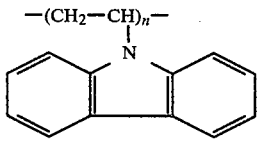

in which n exceeds 30 which is halogenated in the nucleus or (b) contains a mixture of the copolymer optionally halogenated in the nucleus with a bisazide of the formula $N_3RN_3$ in which R represents an organic residue.

6 Claims, 6 Drawing Figures

METHOD OF APPLYING A LAYER IN ACCORDANCE WITH A PATTERN ON A SUBSTRATE, A NEGATIVE RESIST MATERIAL AND A SUBSTRATE COATED WITH THE RESIST

The invention relates to a method of applying a layer in accordance with a pattern on a substrate, wherein a layer of resist material is applied onto the substrate, the resist material is selectively exposed to electrons or to X-rays in accordance with the pattern and the unexposed portion of the resist material is removed.

The invention also relates to a negative electron and/or X-ray resist material on the basis of a component containing a polyvinylcarbazole compound. The invention also relates to a substrate provided with a layer of such a resist material.

The invention relates to a negative electron and/or X-ray resist material which is suitable for use in the production of integrated circuits (IC), particularly for the production of the photomasks and etching masks used therefore.

When making photomasks, a substrate, for example consisting of a chromium layer on glass, is coated with a layer of polymer material, the resist material. A pattern is provided in the resist material by selective exposure of the material. In the case of a negative resist material the exposed portion is less easy to dissolve and, after exposure, the unexposed portion is removed by means of a solvent (development). No details smaller than 2–4 $\mu m$ are obtainable when photons are used. When irradiation is carried out with electrons and/or X-rays it is possible to obtain smaller details namely approximately 0.5 $\mu m$.

Japanese Patent Application, Kokai, 30215/72 describes a method in which a resist material on the basis of poly-N-vinyl carbazole is simultaneously exposed to light and to electrons in order to obtain the highest possible resolution (1 $\mu m$). The sensitivity is such that at an accelerating voltage of 10–30 kV exposure must be done with a charge of $1 \times 10^{-5}$ to $1 \times 10^{-4}$ Coulomb/cm$^2$ (10–100 $\mu C/cm^2$).

It is the object of the invention to provide a more sensitive resist material.

The drawing describes polyvinyl carbazole and bisazides useful in the resist material.

Figure 2:
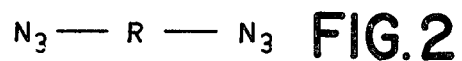
Figure 3:
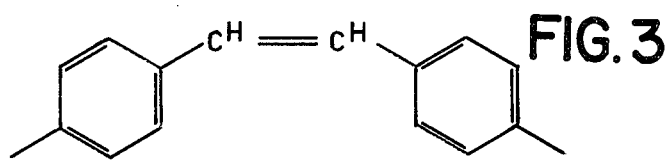
Figure 4:
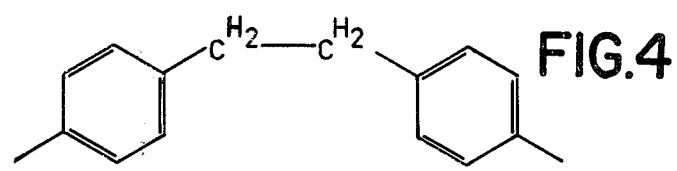
Figure 5:
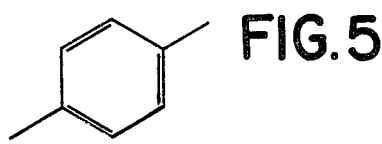
Figure 6:
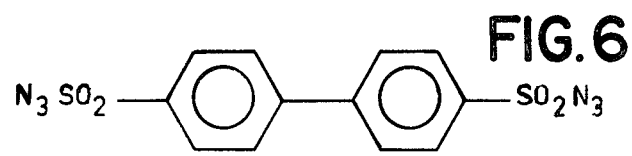

According to the invention the method of applying a layer is characterized in that a resist material on the basis of a component comprising a polyvinylcarbazole compound, which component contains a polymer and/or copolymer defined by formula in FIG. 1 of the drawing wherein n exceeds 30, which is halogenated in the hetero-aromatic nucleus or contains a mixture of such a polymer and/or copolymer halogenated or not halogenated in the hetero-aromatic nucleus, with a bisazide defined by formula in FIG. 2, wherein R represents an organic residue, is applied on the substrate.

According to the invention, the negative electron and/or X-ray resist material is characterized in that the component comprises a polyvinylcarbazole compound which contains a polymer and/or copolymer as defined by formula in FIG. 1 of the drawing, in which n is larger than 30, which is halogenated in the heteroaromatic nucleus or contains a mixture of such a polymer and/or copolymer which is halogenated or not halogenated in the hetero-aromatic nucleus, with a bisazide as defined by formula in FIG. 2, wherein R represents an organic residue.

The substrate according to the invention is characterized in that it is provided with a resist layer containing the resist material according to the invention.

The invention also relates to a method of applying a layer on a substrate in accordance with a pattern, wherein a layer or resist material is applied onto the substrate, the resist material is exposed to electrons or to X-rays in accordance with the pattern and the unexposed portion of the resist material is removed, characterized in that a resist material according to the invention is applied to the substrate.

The invention is based on the recognition of the fact that polyvinylcarbazole as described in the abovementioned Japanese Patent Application can be made more sensitive by halogenating the carbazole group and/or by mixing the polyvinylcarbazole with a bisazide. It was further found that a satisfactory resolution can be obtained without the simultaneous exposure to electrons and photons. The resist material according to the invention has a satisfactory sensitivity and a satisfactory contrast ($\gamma > 1$). For a definition of the contrast reference can be made to L. F. Thompson, Design of polymer resists for electron lithography, Solid State Technology, July 1974, page 30. The sensitivity is such that at 25 kV a dose of only a few (1–3) $\mu C/cm^2$ is sufficient to leave, after development, a layer thickness of 50% of the original thickness. Lines having a width of approximately 0.5 $\mu m$ can be inscribed. The resist material according to the invention furthermore has a satisfactory resistance to dry etching and particularly, to plasma etching.

In addition to the component containing a polyvinylcarbazole compound, the resist material according to the invention contains also a solvent. Suitable solvents are chlorobenzene, dimethylformamide and such like. The resist material may furthermore contain customary constituents such as bond-improving agents, spread improving agents and plasticizers. The resist material may also contain further customary compounds which ensure that after irradiation has ended the polymerisation reaction is stopped (so-called radical capture agents).

The resist material may be applied onto a substrate in accordance with known techniques, such as spraying, dipping and spin-coating. Usually, the resist material is applied by spin-coating in a layer thickness of approximately 0.3–1 $\mu m$. Thereafter, the material together with the substrate is preheated at a temperature of, for example, 90°–180° C. in order to remove the solvent and to ensure a satisfactory bond. Thereafter, the resist material is irradiated in accordance with a predetermined pattern with an electron beam with an accelerating voltage of, for example, 10–30 kV with a dose of some $\mu C/cm^2$. Thereafter, it is developed by dipping or spraying with a suitable solvent (mixture), for example, dimethylformamide, or a mixture of dichloromethane, trichloroethylene and N-butyl-acetate. Mixtures of isopropanol with either cyclopentanone or dimethylformamide are also suitable. Finally, the material is heated once again at 125°–160° C. for, for example for approximately 1 hour to remove the developer.

As the active constituent, the resist material according to the invention comprises a component which contains a polyvinylcarbazole compound, the component containing a compound defined by formula in FIG. 1 of the drawing, which is halogenated in the heteroaromatic nucleus or mixed with a bisazide defined by formula in FIG. 2. The use of an azide cross-linking agent in polystyrene is known per se from Japanese Patent Application Kokai 17015/79. It is alternatively possible to use a mixture of a halogenated polyvinylcarbazole compound and a bisazide.

The polyvinylcarbazole compound defined by formula in FIG. 1 is halogenated in the hetero-aromatic nucleus and/or is mixed with a bisazide. Satisfactory results were obtained with halogenated poly(N-vinylcarbazole) containing 0.05 to 2.0 halogen atoms, preferably bromium, per carbazole group. The halogen atom may be introduced into the polymer or a halogenated monomer can be polymerised.

Preferably, the bisazide defined by formula in FIG. 2 comprises a radical R which corresponds to formula in FIGS. 3, 4, 5 or 6 of the drawing. The bisazide may be substituted, for example, by alkyl, halogen, alkoxy, etc. Suitable bisazides are for example, 4.4′-diazidostilbene, 1,2-di-(4-azidophenyl)ethane, 1,4-diazidobenzene.

Example I (for comparison). The use of fractionated polyvinylcarbazole. A solution of 4% by weight of fractionated poly(N-vinylcarbazole) in chlorobenzene was prepared. The poly(N-vinylcarbazole) was obtained by fractionating the commercially available product Luvican M170. The fraction having a weight-average molecular weight ($\overline{M}_w$) of $1.31 \times 10^6$ and a weight-average molecular weight to number-average molecular weight ($\overline{M}_n$) ratio of 1.8 was used.

The solution was applied to an oxidized silicon wafer in a layer thickness of 0.5 μm by spin-coating. The coated silicon wafer was pre-fired at 130° C. for 1 hour and exposed to an electron beam with an accelerating voltage of 25 kV. The wafer was developed by immersing it in dimethylformamide for 4 minutes. Finally, the wafer was subjected to a further heat treatment at 150° C. for 1 hour.

The dose required to have, after development, 50% of the original layer thickness left in the irradiated sites ("the sensitivity") was 8.1 μC/cm². The contrast was very good ($\gamma=2.1$). Lines having a width of 0.5 μm could be inscribed very well.

Example II (according to the invention). The use of polyvinylcarbazole plus bisazide. 5% by weight (calculated with respect to the polyvinylcarbazole) of 4.4′-diazidostilbene was added to the solution described in Example I. After spin-coating (layer thickness 0.5 μm) the wafer was pre-fired (30 minutes 90° C.), irradiated, developed and subjected to a final heat treatment in the manner described in Example I.

The sensitivity was now approximately 2.2 μC/cm². The contrast was very good ($\gamma=2.2$). Lines having a width of 0.5 μm could be inscribed without any problems.

Example III (according to the invention). The use of Poly(3-bromo-N-vinylcarbazole). Poly(3-bromo-N-vinylcarbazole) having a $\overline{M}_w$ of approximately $1.4 \times 10^5$ and a $\overline{M}_w$ to $\overline{M}_n$ ratio of approximately 2 (estimated by means of gelpermeation chromatography with polystyrene standards) was prepared by cationic polymerisation of 3-bromo-N-vinylcarbazole with tropylium hexachloroantimonate ($0.3 \times 10^{-5}$M) as the initiator at $-25°$ C. in dichloromethane as the solving agent. For this method reference is made to P. M. Bawyer, A. Ledwith and D. C. Sherington, Polymer, London, 509 (1971), which method is incorporated in this description by reference.

A layer having a thickness of 0.32 μm was applied onto an oxidized silicon wafer by spin-coating a solution of 4% by weight of chlorobenzene. The wafer was prebaked (20 minutes 150° C.), developed by immersing it in dimethylformamide for 2½ minutes, and subjected to a final heat treatment (1 hour at 150° C.).

The sensitivity was 1.6 μC/cm² (at 25 kV). The contrast was good ($\gamma=1.4$), whereas lines having a width of 0.4 μm could be inscribed very well.

Example IV (according to the invention). The use of poly(N-vinylcarbazole-co-3-bromo-N-vinylcarbazole). A copolymer consisting of N-vinylcarbazole and 3-bromo-N-vinylcarbazole having a $\overline{M}_w$ of $8.3 \times 10^5$ and $\overline{M}_w$ to $\overline{M}_n$ ratio of approximately 3.4 (determined by gelpermeation chromatography) was prepared by cationic polymerisation in the manner described in Example III. The molar ratio between N-vinylcarbazole and 3-bromo-N-vinylcarbazole was 90:10.

A solution of 4% by weight of the copolymer in chlorobenzene was spin-coated on an oxidized silicon wafer to a layer thickness of 0.43 μm. The wafer was pre-baked (20 minutes 180° C.), exposed to an electron beam of 25 kV and developed by immersing it in chlorobenzene (3 minutes). The wafer was finally subjected to a further heat treatment (1 hour at 150° C.).

The sensitivity was 2.7 μC/cm². The contrast was good ($\gamma=1.7$). Lines having a width of 0.5 μm could be inscribed very well by means of spraying during development (first with N-methylpyrrolidone, followed by a mixture of N-methylpyrrolidone and isopropanol and, finally, with pure isopropanol).

The homopolymer of N-vinylcarbazole prepared in a similar manner as described above for the copolymer ($\overline{M}_w=8.3 \times 10^5$, $\overline{M}_w$ to $\overline{M}_n=3.6$) had a sensitivity of 16 μC/cm² and a contrast of $\gamma=1.6$.

All the cross-linked resist materials described above had a high plasma etch resistance.

What is claimed is:

1. In the method for forming a pattern layer on a substrate wherein a layer of a polymeric material containing resist material is applied onto the substrate, the resist material is selectively exposed to electrons or to X-rays in accordance with a pattern and the unexposed portion of the resist material is removed, the improvement wherein the polymeric material is selected from the group consisting of hetero-aromatic halogenated derivatives of the vinyl carbazole polymer defined by formula 1 of the drawing where n exceeds 30, the vinyl carbazole polymer defined by formula 1 of the drawing where n exceeds 30 and copolymers thereof, and present at least when the polymeric material is other than a hetero-aromatic halogenated derivative of the vinyl carbazole polymer, a bisazide as defined by formula 2 of the drawing wherein R is an organic residue as defined by formulae 3, 4 or 5 of the drawing.

2. The method of claim 1 wherein the polymeric material consists of a poly (N-vinylcarbazole) halogenated with 0.05 to 2.0 halogen atoms per carbazole group.

3. The method of claim 2 wherein the poly (N-vinylcarbazole) contains from 0.05 to 2.0 bromine atoms per carbazole group.

4. A negative electron and/or X-ray polymeric material containing resist material which resist material comprises a mixture of a bisazide defined by formula 2 or the drawing wherein R is an organic residue as defined by formulae 3, 4 or 5 of the drawing and a polymeric material consisting of a polyvinyl carbazole as defined by formula 1 of the drawing wherein n exceeds 30, a hetero-aromatic halogenated derivative of said polyvinyl carbazole or a copolymer of said polyvinyl carbazole and said halogenated polyvinyl carbazole.

5. A negative resist material as claimed in claim 4, wherein the polymeric material is a non-halogenated poly (n-vinyl carbozole) and 0.5–10 percent by weight of 4, 4' diazidostilbene is present.

6. A substrate provided with a resist layer, characterized in that the substrate has been provided with a resist layer consisting of the resist material as claimed in claim 4, or claim 5.

* * * * *